United States Patent [19]

Kawakami et al.

[11] Patent Number: 5,025,116
[45] Date of Patent: Jun. 18, 1991

[54] PRINTED WIRING BOARD HAVING ELECTROMAGNETIC WAVE SHIELDING LAYER

[75] Inventors: Shin Kawakami; Katsutomo Nikaido; Junichi Ichikawa, all of Saitama, Japan

[73] Assignee: Nippon CMK Corp., Japan

[21] Appl. No.: 470,881

[22] Filed: Jan. 26, 1990

[30] Foreign Application Priority Data

Jan. 27, 1989 [JP] Japan .................... 18328/89

[51] Int. Cl.$^5$ ............................................. H05K 01/00
[52] U.S. Cl. ....................... 174/250; 174/254; 174/257; 174/258; 174/35 R
[58] Field of Search ............... 174/35 R, 254, 250, 174/257, 258

[56] References Cited

U.S. PATENT DOCUMENTS 4,647,714  3/1987  Goto ........................ 174/35 R
4,675,786  6/1987  Mizuko et al. ................ 174/254

Primary Examiner—Gerald P. Tolin
Assistant Examiner—Trinidad Korka
Attorney, Agent, or Firm—Bruce L. Adams; Van C. Wilks

[57] ABSTRACT

A printed wiring board having electromagnetic wave shielding layer for use in the integrated semiconductor circuit is disclosed. The printed wiring board comprises an insulating sheet, printed wiring circuits and grounded wiring circuit which are provided on one surface of the insulating sheet, an insulating layer provided on the surface of the insulating sheet, the printed wiring circuit and the grounded wiring circuit, an electromagnetic wave shielding layer provided on the insulating layer and having a portion contacted to the ground wiring circuit directly, and an over-coating layer provided on the electromagnetic wave shielding layer and having exposed portions placed over the contacted portion of the shielding layer.

8 Claims, 1 Drawing Sheet

PRINTED WIRING BOARD HAVING ELECTROMAGNETIC WAVE SHIELDING LAYER

BACKGROUND OF THE INVENTION

The present invention relates to a printed wiring board having an electromagnetic wave shielding layer.

Recently, a printed wiring board having a shielding layer has been developed for preventing normal oPeration of a circuit from being interferred with due to electrical noise from external instruments.

An embodiment of such a printed wiring board having an electromagnetic wave shielding layer is concretly shown in FIG. 2. The printed wiring board comprises an electrical insulating sheet 1, a printed wiring circuit 2 provided on one major surface of the sheet, an electrcal layer 3 provided on the printed wiring circuit, an electromagnetic wave shielding layer 4 provided thereon and an over-coating layer 5 provided on the whole surface thereof for protecting the shielding layer.

A contact portion 6 is provided between the electromagnetic wave shielding layer 4 and grounded wiring circuits 2a for electrically contacting therebetween.

This contact portion 6 between the shielding layer 4 and grounded wiring circuit 2a may be provided for any position and at least two positions in the whole printed wiring circuit 2.

In this case, the electromagnetic wave shielding layer 4 of the printed wiring board is formed by using conductive ink which is formed by mixing conductive metal powder with resin ink by applying this conductive ink onto the electrical insulating layer with a silk screen printing method, and by drying and hardening the conductive ink.

On considering characteristics of the conductive ink, a great amount of metal powders must be mixed in the resin in order to increase conductivity. In this case, the resin amount in the conductive ink becomes small, resulting in a decrease of adhesive force to the contact portion.

Particularly, when electrical or electronic components, such as a capacitor are mounted on the printed wiring board, the fixing of the electronic components is performed by the soldering under the condition at about 260° C. for 3~10 sec.

In this case, the mounting of such electronic components has an affects on the adhesive force of the electromagnetic wave shielding layer 4 with a thermal shock caused by the soldering. Moreover, the difference in thermal expansion coefficient between the printed wiring circuit 2 of copper foil and the over-coating layer 4 in the printed wiring board becomes remarkable at the contact portion 6 of the electromagnetic wave shielding layer 4 under high temperature conditions, thereby causing a pealing-off of the contact portion.

SUMMARY OF THE INVENTION

It is an object of the present invention to reject the above described disadvantages of the conventional printed wiring board.

It is another object of the present invention to provide a printed wiring board having an electromagnetic wave shielding layer capable of preventing the contact portion of the shielding layer and the grounded wiring circuit from pealing-off therefrom and capable of preventing the adhesive strength of the whole shielding layer from being decreased.

According to the present invention, there is provided a printed wiring board having an electromagnetic wave shielding layer comprising an insulating sheet, printed wiring circuits and grounded wiring circuit which are provided on one surface of the insulating sheet, an insulating layer provided on the surface of the insulating sheet, the printed wiring circuit and the grounded wiring circuit, an electromagnetic wave shielding layer provided on the insulating layer and having a portion contacted to the grounded wiring circuit directly, and an over-coating layer provided on the electromagnetic wave shielding layer and having exposed portions placed over the contact portion of the shielding layer.

In a preferred embodiment of the present invetion, the expose portion of the shielding layer is formed by making holes in the over-coating layer over the contact portion of the shielding layer. The exposed portion of the shielding layer is placed on a part of the contact portion of the shielding layer to the grounded wiring circuit. The exposed portion of the shielding layer is placed ,on a whole part of the contact portion of the shielding layer to the grounded wiring circuit.

According to the printed wiring board having an electromagnetic wave shielding layer of the present invention, the surface portion of the electromagnetic wave shielding layer is exposed over the contact portion between the shielding layer and the grounded wiring circuit by making a hole in the over-coating layer provided on the shielding layer, thereby absorbing the distortion of the over-coating layer caused by thermal expansion with the exposed portion, so that the distortion at the contact portion of the electromagnetic wave shielding layer and the grounded wiring circuit is caused only by thermal expansion action therebetween, thereby obtaining an action for preventing a pealing - off at the contact portion between the electromagnetic wave shielding layer and the grounded wiring circuit

DETAILED EXPLANATION OF THE PREFERRED EMBODIMENTS

Now to the drawings, there is shown one embodiment of a printed wiring board having an electromagnetic wave shielding layer according to the present invention.

Figure 1:
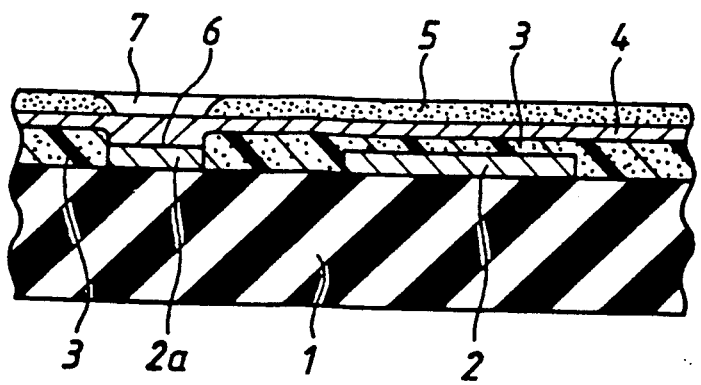
FIG. 1 is a cross-sectional view showing an embodiment of a printed wiring board having electromagnetic wave shielding layer according to the present invention.
Figure 2:
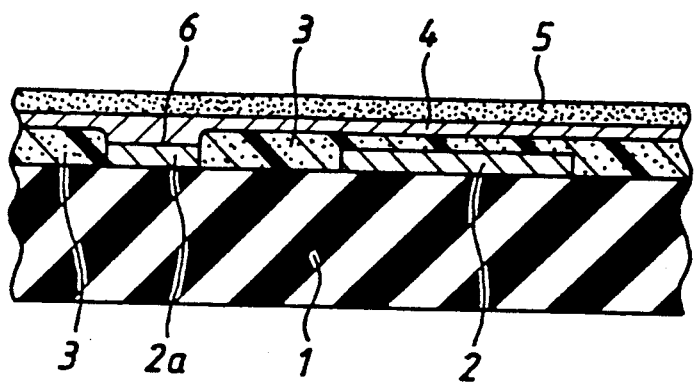
FIG. 2 is a cross-sectional view showing a conventional printed wiring board having an electromagnetic wave shielding layer.

As shown in FIG. 1, a printed wiring board having electromagnetic wave shielding layer according to the present invention comprises an electrical insulating sheet 1, a printed wiring circuit 2 provided on one major surface of the sheet, an electrical insulating layer 3 provided on the printed wiring circuit and an electromagnetic wave shielding layer 4 provided thereon. This structure is the same as that of the printed wiring board shown in FIG. 2.

The printed wiring board according to the present invention further comprises an over-coating layer 5 provided on the electromagnetic wave shielding layer 4. This overcoating layer 5 is provided with holes positioned over the contact portion 6 of the shielding layer 4 to a grounded (earth) wiring circuit 2a so as to expose the surface of the shielding layer positioned over the contact portion 6.

The exposed portion 7 of the shielding layer 4 must not be provided at the whole position of the contact portion 6 for the shielding layer 4 to the grounded wiring circuit 2a, and may be provided only at selected positions of the contact portion 6 required to obtain necessary function in design.

The shape of the exposed portion 7 may also made correspondent to that of the contact portion 6 between the electromagnetic wave shielding layer 4 and the grounded wiring circuit 2a, for example, circular or rectangular. The shape of the exposed portion 7 is not limited to the shape correspondent to that of the contact portion 6, but may be made the shape required to obtain given necessary function in design.

According to the above constructed printed wiring board, a pealing-off between the electromagnetic wave shielding layer 4 and the grounded wiring circuit 2a due to distortion caused by thermal expansion, may be prevented by providing the exposed portion 7 between the shielding layer 4 and the over-coating layer 5 and over the contact portion 6 between the shielding layer 4 and the grounded wiring circuit 2a.

That is, in the conventional printed wiring board, the over-coating layer 5 is coated on the whole surface of the electromagnetic wave shielding layer 4, so that the distortion caused by the difference in thermal expansion coefficient among the grounded wiring circuit 2a of copper foil, the electrical insulating layer 3, the electromagnetic wave shielding layer 4 and the over-coating layer 5, effects synthetically on thereamong, thereby causing a pealing-off thereamong, and then adhesive force at the contact portion 6 between the shielding layer 4 and the grounded wiring circuit 2a must be increased.

According to the present invention, the over-coating layer 5 is not coated on the whole surface of the shielding layer 4, but partially covered on the surface of the shielding layer 4. That is, the exposed portion 7 of the shielding layer 4 is provided at the selected position over the contact portion 6 between the shielding layer 4 and the grounded wiring circuit 2a by making holes in the over-coating layer 5, so that the distortion caused by synthetic thermal expansion effect among respective layers may be absorbed or prevented and thus the pealing-off between the electromagnetic wave shielding laYer 4 and the grounded wiring circuit 2a may be prevented by the adhesive force corresponding to the distortion caused by the difference in thermal expension coefficient therebetween over the contact portion 6 thereof.

As a result of this the selection range of the composition rate of metal powder capable of increasing conductivity of the electromagnetic wave shielding layer 4 for resin ink, becomes wide, thereby increasing quality, performance and durability of the printed wiring board having an electromagnetic wave shielding layer.

What is claimed is:

1. A printed wiring board comprising: an insulating sheet; printed wiring circuit and a grounded wiring circuit on one surface of the insulating sheet; an insulating layer on the surface of the insulating sheet, the printed wiring circuit and a portion of the grounded wiring circuit; an electromagnetic wave shielding layer provided on the insulating layer and having a portion in direct contact with uncovered portions of the grounded wiring circuit; and an over-coating layer provided on the electromagnetic wave shielding layer; and wherein portions of the electromagnetic wave shielding layer over the portion in direct contact with the ground wiring circuit are exposed.

2. A printed wiring board as claimed in claim 1, wherein the shielding layer is exposed by making holes in the over-coating layer.

3. A printed wiring board as claimed in claim 1, wherein the exposed portion of the shielding layer is smaller in area than the portion in direct contact with the grounded wiring circuit.

4. A printed wiring board as claimed in claim 1, wherein the exposed portion of the shielding layer is disposed on the whole portion in direct contact with the grounded wiring circuit.

5. A printed circuit board comprising: an insulating substrate having a main surface; a printed circuit of conductors on the main surface including at least one ground conductor; an insulating layer over the printed circuit of conductors without covering portions of the ground conductor; an electromagnetic wave shielding layer over the insulating layer and having a portion directly contacting the portion of the ground conductor not covered by the insulating layer; and an over-coating layer covering the electromagnetic wave shielding layer with a portion of the electromagnetic wave shielding layer, which lies directly over said portion of the ground conductor not covered by the insulating layer, being exposed.

6. The printed circuit board as claimed in claim 5, wherein the shielding layer is exposed by a hole formed in the over-coating layer.

7. The printed circuit board as claimed in claim 5, wherein the exposed portion of the shielding layer is smaller in area than the portion in direct contact with the ground conductor.

8. The printed circuit board as claimed in claim 5, wherein the exposed portion of the shielding layer is disposed on the whole portion in direct contact with the ground conductor.

* * * * *